United States Patent [19]

Kawakami et al.

[11] Patent Number: 5,308,644
[45] Date of Patent: May 3, 1994

[54] METHOD FOR MANUFACTURING A PRINTED WIRING BOARD HAVING A SHIELD LAYER

[75] Inventors: Shin Kawakami; Satoshi Haruyama; Hirotaka Okonogi, all of Iruma, Japan

[73] Assignee: Nippon CMK Corp., Japan

[21] Appl. No.: 739,708

[22] Filed: Aug. 2, 1991

[30] Foreign Application Priority Data

Aug. 13, 1990 [JP] Japan .................................. 2-214077

[51] Int. Cl.5 ............................................. C23C 26/00
[52] U.S. Cl. .................................... 427/96; 427/404; 427/405
[58] Field of Search .......................... 427/96, 404, 405

[56] References Cited

U.S. PATENT DOCUMENTS

| | | | |
|---|---|---|---|
| 4,622,239 | 11/1986 | Schoenthaler | 427/96 |
| 4,664,945 | 5/1987 | Maeda | 427/96 |
| 4,720,402 | 1/1988 | Wojcik | 427/96 |
| 4,970,354 | 11/1990 | Iwasa | 427/96 |
| 5,030,800 | 7/1991 | Kawakami | 174/264 |
| 5,055,321 | 10/1991 | Enomoto | 427/96 |
| 5,112,648 | 5/1992 | Okonogi | 427/96 |
| 5,133,120 | 7/1992 | Kawakami | 427/97 |

FOREIGN PATENT DOCUMENTS

| | | | |
|---|---|---|---|
| 4-075398 | 3/1992 | Japan | 427/97 |
| 4-076991 | 3/1992 | Japan | 427/97 |
| 4-094592 | 3/1992 | Japan | 427/97 |
| 4-094593 | 3/1992 | Japan | 427/97 |
| 2247112 | 2/1992 | United Kingdom | 427/97 |

Primary Examiner—Shrive Beck
Assistant Examiner—Vi Duong Dang
Attorney, Agent, or Firm—Bruce L. Adams; Van C. Wilks

[57] ABSTRACT

The method for manufacturing the printed wiring board having a shield layer of the present invention is characterized in that, in a method for manufacturing a printed wiring board wherein a printed wiring circuit is provided on one or both sides of an insulating board and a shield layer is provided on the printed wiring circuit through an insulating layer, a shield layer and an earth circuit are formed on the insulating layer while injecting under pressure a coating for shield from a filling nozzle through a mask.

1 Claim, 2 Drawing Sheets

# METHOD FOR MANUFACTURING A PRINTED WIRING BOARD HAVING A SHIELD LAYER

FIELD OF THE INVENTION

The present invention is related to a method for manufacturing a printed wiring board having a shield layer.

The method of providing an electromagnetic wave shield layer in a printed wiring board through an insulating layer is described in Patent Application Laid-Open No. 213192/1987 and thus it is already publicly known, and as shown in FIG. 3, a printed wiring board 9 is constituted by providing electromagnetic wave shield layer 5 over printed wiring circuits 2 formed on both sides of an insulating board 1 through an insulating layer 4, and providing earth circuit 5a between the two and a solder resist layer 6.

The electromagnetic wave shield layer 5 of the printed wiring board 9 is formed over the board except for the region through hole 7 for conduction by a plated through hole 8, or for electronic parts connecting lands, not shown.

The shield layer 5 of the printed wiring board 9 is usually formed by printing a conductive coating by means of the silk screen printing, but if shield layer 5 is provided on the whole surface of insulating board 1, it is difficult to make its layer thickness uniform and the desired shield effect may not appropriately be obtained. By the same token, a shield layer 5 having an appropriate layer thickness can not always be obtained if the shield layer 5 is provided only over a required portion, and accordingly it lacks of stability.

In addition, the earth circuit 5a with the printed wiring circuit 2 of the printed wiring board 9 is also formed by silk screen printing simultaneously with the shield layer 5, but the coating is not fully introduced to the portion of the earth circuit 5a and connection failure may occur.

SUMMARY OF THE INVENTION

Accordingly, the present invention was developed to remedy the defects in the traditional method for forming a shield layer, and its object is to provide a manufacturing method of good workability which can always form a shield layer having a stable layer thickness and can also form an earth circuit without fear of connection failure.

DETAILED DESCRIPTION OF THE PREFERRED EMBODIMENT

The embodiments of the method for manufacturing a printed wiring board having a shield layer according to the present invention are described with reference to the accompanying drawings.

Figure 1:
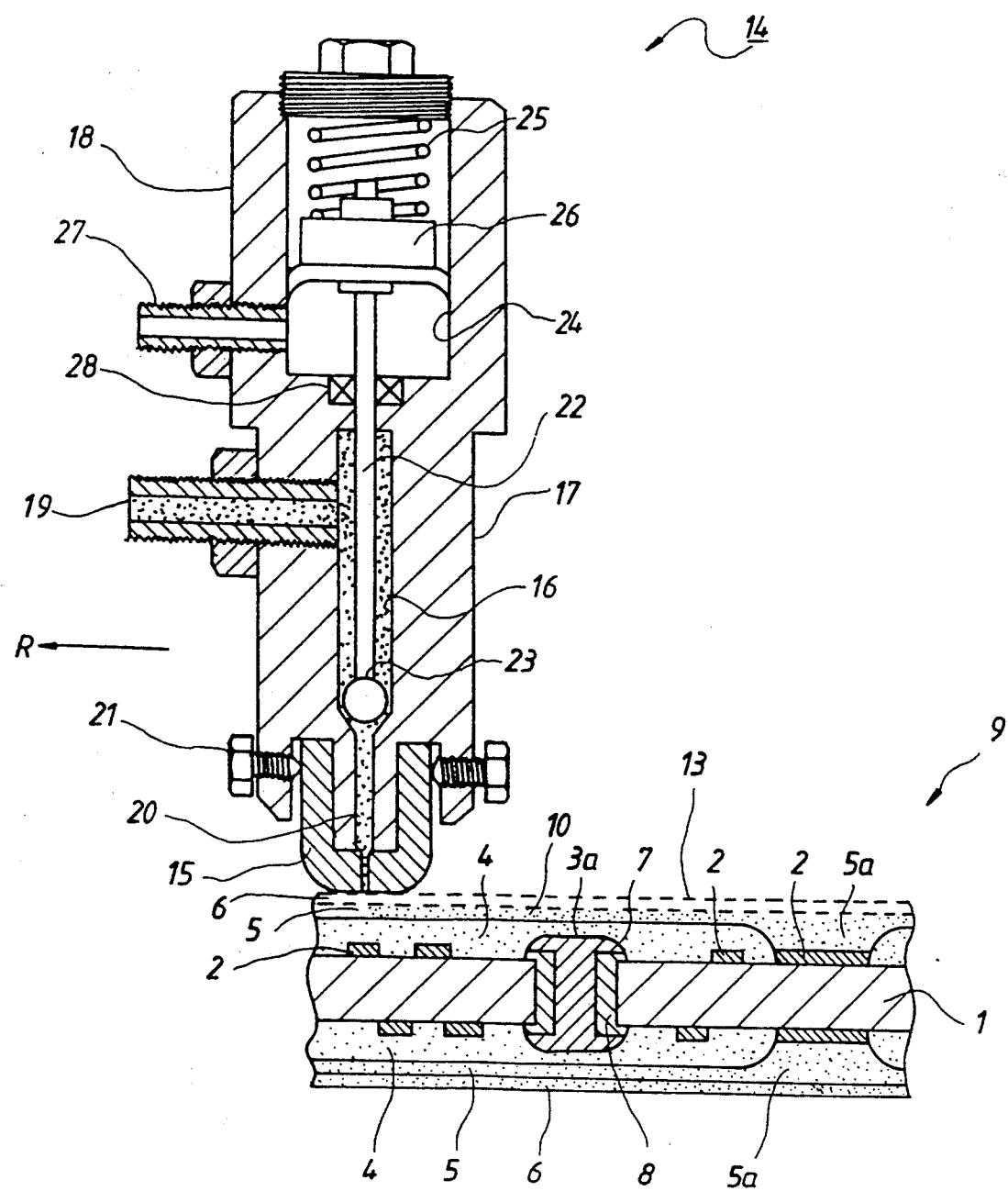
FIGS. 1 and 2 are explanatory views showing the first and second embodiments of the present invention.

FIG. 1 is an explanatory view showing a first embodiment of a method for manufacturing the printed wiring board according to the present invention.

An insulating board 1 contains, on both sides thereof, printed wiring circuits 2 formed through a plated through hole 8. A sealing member 3a is filled in the conducting through hole portion 7, and such sealing member 3a is made of a thermosetting synthetic resin material such as epoxy resin or a photo-setting synthetic resin material such as acryl epoxy resin. The sealing member 3a is formed by filling a paste made of such synthetic resin material in each through hole portion 7 of the printed wiring board 9 by means of screen printing or the like, and thereafter hardening it.

Insulating layers 4 are also formed by screen printing or the like, and electromagnetic wave shield layers 5 are formed on the insulating layers 4. In forming such electromagnetic wave shield layers 5, the printed wiring board 9 is mounted and set on a mounting base (not shown) and a mask 13 is aligned and set on the printed wiring board 9.

Thereafter, a coating 10 for an electromagnetic wave shield is discharged from the nozzle end 15 of a filling nozzle 14 used for electromagnetic wave shield coating which is mounted above the mask 13 for horizontal movement, and coating 10 for electromagnetic wave shield is applied on insulating layer 4 of printed wiring board 9 through mask 13.

In addition, the filling nozzle 14 consists of a nozzle main body 17 provided with a filling section 16 for containing the coating 10 for the electromagnetic wave shield, and an operation section 18 of a discharge valve provided above filling section 16 of the nozzle main body 17.

The coating 10 for the electromagnetic wave shield is supplied to the filling section 16 through a supply port 19 from a supply section (not shown), and nozzle end 15 is removably attached to a discharge hole 20 of filling section 16 by means of mounting screws 21.

Further, a discharge valve 23 is mounted on discharge hole 20 of filling section 16 through an operation lever 22, and the top end of the operation lever 22 is coupled to an operation valve 26 elastically mounted by a spring 25 in operation chamber 24, which is provided above the nozzle main body 17.

Moreover, the operation chamber 24 of the operation section 18 is connected to an air pressure source (not shown) for operation through a connecting port 27 and a control section (not shown).

A slide bearing 28 is provided for the operation lever 22.

Accordingly, to apply coating 10 for an electromagnetic wave shield on insulating layer 4 via mask 13 by means of filling nozzle 14 constructed above, filling nozzle 14 is operated via the operation section (not shown) to abut nozzle end 15 on the upper surface of mask 13 and moved in the horizontal direction.

The portion of printed wiring board 1 to be coated is scanned during the horizontal movement, and at its corresponding position, operation lever 22 of operation section 18 is risen against the elastic force of spring 25 to open discharge valve 23 for opening discharge hole 20, and coating 10 for the electromagnetic wave shield, which is fed under pressure from connecting port 19 into filling section 16 through the supply source, is discharged from nozzle end 15 to apply coating 10 for the electromagnetic wave shield on insulating layer 4 through mask 13.

In addition, the electromagnetic wave shield layer 5 is formed by hardening the coating 10 for the electromagnetic wave shield applied on the insulating layer 4, on which solder resist layer 6, also acting as a protective layer is formed.

In the applying process of the coating 10 for the electromagnetic wave shield, the coating is also filled in the earth circuit portion so that earth circuit 5a can also be formed simultaneously with the formation of the electromagnetic wave shield layer 5.

The layer thickness of the insulating layer 5 is 20 to 50 μm.

Figure 2:
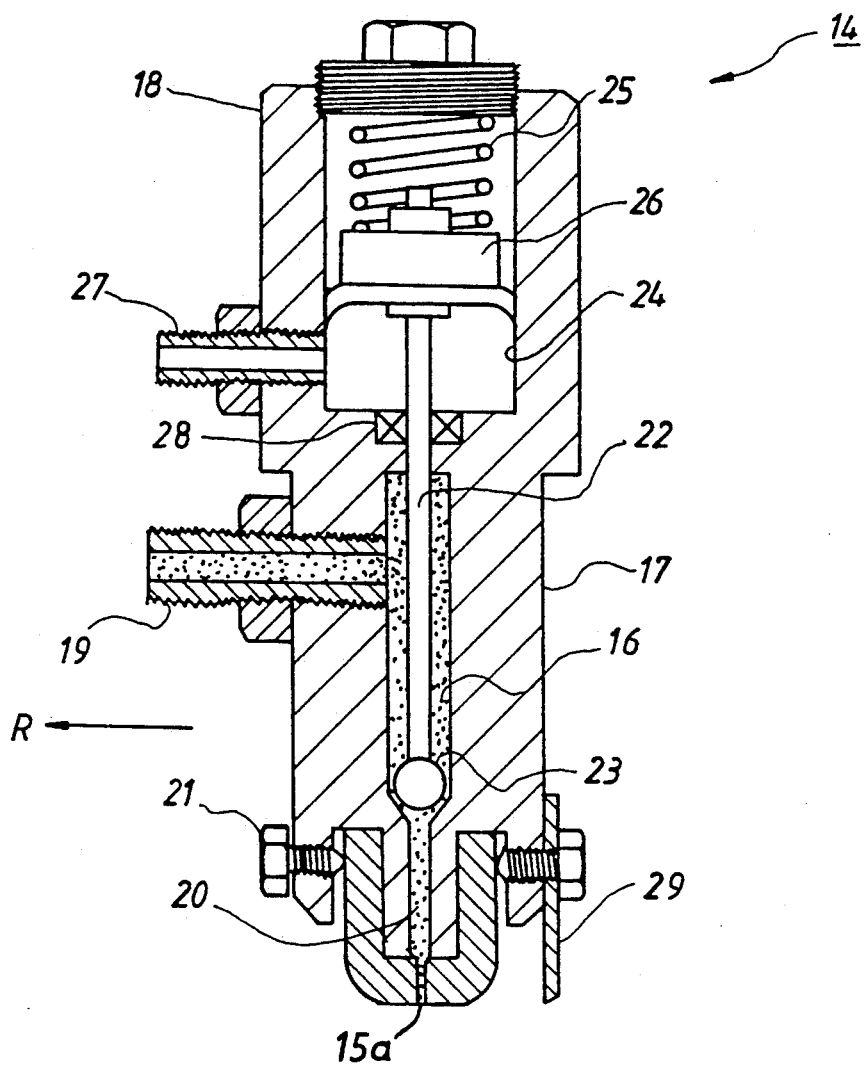
Figure 3:
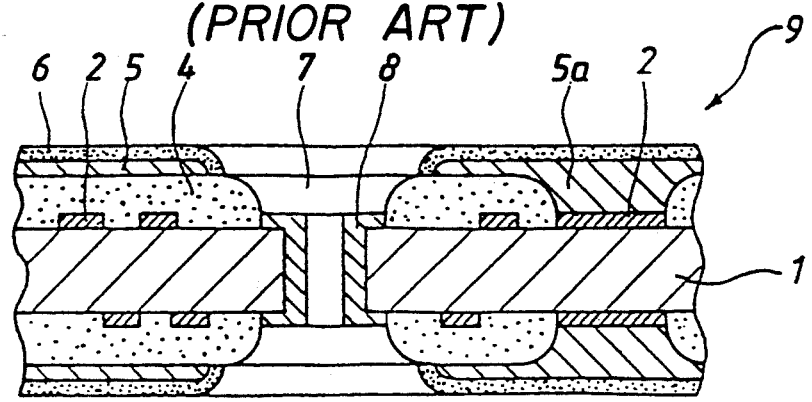
FIG. 3 is an explanatory view of the conventional printed wiring board having a shield layer.

FIG. 2 is an explanatory view showing a second embodiment of the present invention.

This embodiment is different in the construction of the filling nozzle 14 used in the first embodiment, but the same in other means, and thus the same reference numerals are assigned to the same structural portions in the figure and the concrete description of those means is omitted.

A squeegee 29 is thus attached to nozzle end 15 in the construction of filling nozzle 14.

This squeegee 29 is attached in a position behind filling nozzle 14 with respect to the advance direction in the horizontal moving direction thereof.

Accordingly, as filling nozzle 14 is horizontally moved after coating 10 for the electromagnetic wave shield is applied on insulating layer 4 by filling nozzle 14, the coating 10 for electromagnetic wave shield exposed on insulating layer 4 can be removed along mask 13 by squeegee 29 attached to the nozzle end 15.

In addition, nozzle end 15 can be changed by mounting screws 21 so as to select the size of its discharge hole 15a, but it is desirably formed of a plastic material or synthetic rubber in consideration of the wear resistance of the surface abutting mask 13 and the protection of mask 13, and similarly it is desirable to consider the material of squeegee 29.

In FIG. 1, the shield layer 5 for the printed wiring circuit 2 on the underside of printed wiring board 9 is shown having already been formed.

In accordance with the present invention, a shield layer of a uniform layer thickness can be formed with good workability and without producing irregularities in the layer thickness of the shield layer, and a proper earth circuit can be formed without causing connection failure by also forcibly feeding and applying under pressure the coating for the shield onto the earth circuit.

What is claimed is:

1. In a method for manufacturing a printed wiring board having a printed wiring circuit provided on one or both sides of an insulating board and a shield layer provided on the printed wiring circuit through an insulating layer, the steps of: forming a shield layer and an earth circuit by injecting a shield coating material under pressure on said insulating layer through a mask from a nozzle; and removing excess shield coating material from the printed wiring board by a squeegee attached to the nozzle.

* * * * *